United States Patent
Won

(10) Patent No.: US 7,332,404 B2
(45) Date of Patent: Feb. 19, 2008

(54) METHOD OF FABRICATING CAPACITOR HAVING METAL ELECTRODE

(75) Inventor: Seok-Jun Won, Seoul (KR)

(73) Assignee: Samsung Electronics Co., Ltd. (KR)

( * ) Notice: Subject to any disclaimer, the term of this patent is extended or adjusted under 35 U.S.C. 154(b) by 269 days.

(21) Appl. No.: 11/065,988

(22) Filed: Feb. 25, 2005

(65) Prior Publication Data

US 2005/0230729 A1    Oct. 20, 2005

(30) Foreign Application Priority Data

Apr. 14, 2004 (KR) ............... 10-2004-0025725

(51) Int. Cl.
*H01L 21/20* (2006.01)
(52) U.S. Cl. ..................................... 438/396
(58) Field of Classification Search .................. 438/396
See application file for complete search history.

(56) References Cited

U.S. PATENT DOCUMENTS 6,168,989 B1 *  1/2001  Chiang et al. ............. 438/253
7,132,326 B2 * 11/2006  Lee et al. ................... 438/253

FOREIGN PATENT DOCUMENTS

| JP | 2002-124583 | 4/2002 |
| KR | 01-56241 | 7/2001 |
| KR | 02-93508 | 12/2002 |
| KR | 03-42268 | 5/2003 |

* cited by examiner

*Primary Examiner*—Howard Weiss
(74) *Attorney, Agent, or Firm*—Mills & Onello LLP

(57) ABSTRACT

In a method of fabricating a capacitor, an interlayer insulating layer is formed on a semiconductor substrate. A contact plug penetrating the interlayer insulating layer is formed. An oxidation barrier layer and a molding layer are sequentially formed on the semiconductor substrate having the contact plug and the interlayer insulating layer. The molding layer is patterned to form a first lower electrode contact hole which exposes the oxidation barrier layer on the contact plug. An electrode layer pattern covering an inner sidewall of the first lower electrode contact hole is formed. The oxidation barrier layer exposed by the electrode layer pattern is etched to form a second lower electrode contact hole which exposes the contact plug. A conductive layer pattern covering an inner wall of the second lower electrode contact hole is then formed.

14 Claims, 5 Drawing Sheets

METHOD OF FABRICATING CAPACITOR HAVING METAL ELECTRODE

CROSS-REFERENCE TO RELATED APPLICATION

This application claims the benefit of Korean Patent Application No. 2004-25725, filed on Apr. 14, 2004, the contents of which are hereby incorporated herein by reference in their entirety.

BACKGROUND OF THE INVENTION

1. Field of the Invention

The present invention relates to a semiconductor device and a method of fabricating the same and, more particularly to a capacitor having a metal electrode and a method of fabricating the same.

2. Description of the Related Art

Semiconductor memory devices such as dynamic random access memory devices (DRAMs) store data in a capacitor of a unit cell. The unit cell of the DRAM includes one access transistor and one cell capacitor that are serially connected. However, as DRAM devices continue to become increasingly integrated, the circuit area that is to be occupied by the unit cell is remarkably reduced, so that the capacitance of the capacitor is likewise reduced. The capacitance of the capacitor represents data storage capacity. When the capacitance of the capacitor is small, reading errors may occur during a read operation of stored data. Therefore, a capacitor with relatively high capacitance is required to maintain high performance in the DRAM device.

Typically, in order to implement a capacitor with high capacitance, a material having a high dielectric constant such as $Ta_2O_5$ or BST $((Ba,Sr)TiO_3)$ is used as a dielectric layer material. However, in the case where such materials are used as a dielectric layer, it is difficult for a polysilicon layer, which is a common electrode material, to be used as a capacitor electrode. This is because when the thickness of the dielectric layer is reduced, tunneling occurs in the device, in turn causing leakage current. For these reasons, when a high-k dielectric layer or a ferroelectric layer is used as a dielectric layer, noble metals with a low work function such as platinum Pt, ruthenium Ru, iridium Ir, rhodium Rh, or osmium Os are used as capacitor electrode materials. Of these, ruthenium Ru has an advantageous property in that it is easily etched by plasma containing oxygen, and thus is widely used as upper and lower electrodes of a metal-insulator-metal (MIM) type capacitor.

However, in the MIM type capacitor, when a noble metal such as ruthenium Ru is used as a lower electrode, the lower electrode is commonly formed by depositing the ruthenium using a chemical vapor deposition (CVD) technique or an atomic layer deposition (ALD) technique to improve step coverage. In the CVD or ALD technique, oxygen is added as a process gas to improve layer characteristics such as morphology. However, when the lower electrode layer contains oxygen, this oxidizes a surface of a contact plug at an interface with the contact plug. Thus, an oxidation reaction occurs at the interface, thereby increasing contact resistance.

SUMMARY OF THE INVENTION

The present invention provides a capacitor and a method of fabrication thereof in which an interface reaction between the lower electrode and the contact plug is prevented to thereby prevent or mitigate increase in contact resistance.

One embodiment of the invention provides a capacitor and method of fabricating the same that are suitable for eliminating an increase in contact resistance between the lower electrode and the contact plug when the lower electrode is formed of a noble metal such as ruthenium, platinum or iridium.

In one aspect, the invention is directed to a capacitor having a metal electrode. The capacitor includes an interlayer insulating layer that is formed on a semiconductor substrate. A contact plug penetrates the interlayer insulating layer. An oxidation barrier layer is provided on the contact plug and the interlayer insulating layer. A conductive layer pattern penetrates the oxidation barrier layer to come into contact with the contact plug. An electrode layer pattern surrounds an outer sidewall of the conductive layer pattern and is located on the oxidation barrier layer.

The conductive layer pattern may cover the inner sidewall of the electrode layer pattern. Preferably, the portion of the conductive layer pattern on the inner sidewall of the electrode layer pattern is thinner than the portion of the conductive layer pattern on the contact plug.

Preferably, the electrode layer pattern and the conductive layer pattern are noble metal layers. The noble metal layer is formed of ruthenium, platinum or iridium.

An attack barrier layer may be disposed between the interlayer insulating layer and the oxidation barrier layer.

A support layer is optionally provided on the oxidation barrier layer and surrounding a lower portion of an outer sidewall of the electrode layer pattern.

The oxidation barrier layer may be formed of a silicon nitride layer.

In another aspect, the invention is directed to a method of fabricating a capacitor. The method of fabricating the capacitor includes forming an interlayer insulating layer on a semiconductor substrate. A contact plug penetrating the interlayer insulating layer is formed. An oxidation barrier layer and a molding layer are sequentially formed on the semiconductor substrate having the contact plug and the interlayer insulating layer. The molding layer is patterned to form a first lower electrode contact hole which exposes the oxidation barrier layer on the contact plug. An electrode layer pattern covering an inner sidewall of the first lower electrode contact hole is formed. The oxidation barrier layer exposed by the electrode layer pattern is etched to form a second lower electrode contact hole which exposes the contact plug. A conductive layer pattern covering an inner wall of the second lower electrode contact hole is formed.

In one embodiment, a sacrificial layer pattern is formed that fills the conductive layer pattern. The conductive layer pattern is cylindrical in shape.

Preferably, the electrode layer pattern and the conductive layer pattern are formed of noble metal layers. The noble metal layer is formed of ruthenium, platinum or iridium.

The electrode layer pattern may include a lower electrode layer pattern or a lower electrode seed layer pattern and a lower electrode layer pattern.

The lower electrode layer pattern is formed using a CVD technique or an ALD technique. The CVD and ALD techniques are PECVD and plasma ALD techniques, respectively.

The lower electrode seed layer pattern may be formed using a physical vapor deposition (PVD) technique.

The conductive layer pattern may be formed using a PVD technique.

An attack barrier layer may be formed on the interlayer insulating layer before forming the contact plug, after forming the interlayer insulating layer. Thereafter, the contact plug is formed to penetrate the interlayer insulating layer and the attack barrier layer.

A support layer may be formed on the oxidation barrier layer before forming the molding layer on the oxidation barrier layer. Thereafter, the first lower electrode contact hole is formed by patterning the molding layer and the support layer to thereby expose the oxidation barrier layer on the contact plug.

The oxidation barrier layer may be formed of a silicon nitride layer.

The contact plug may be formed of TiN, tungsten (W) or a combination thereof.

BRIEF DESCRIPTION OF THE DRAWINGS

The foregoing and other objects, features and advantages of the invention will be apparent from the more particular description of preferred embodiments of the invention, as illustrated in the accompanying drawings. The drawings are not necessarily to scale, emphasis instead being placed upon illustrating the principles of the invention.

DETAILED DESCRIPTION OF THE INVENTION

Figure 1:
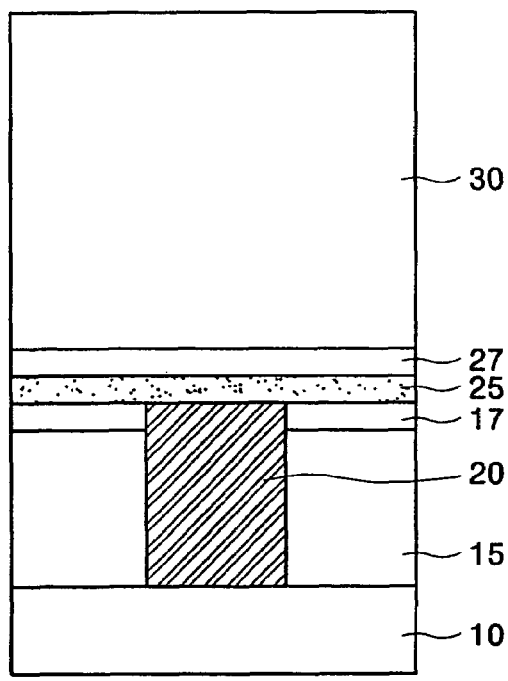
FIGS. 1 to 9 are cross-sectional views illustrating a method of fabricating a capacitor according to embodiments of the present invention.

The present invention will now be described more fully hereinafter with reference to the accompanying drawings, in which exemplary embodiments of the invention are shown. In the drawings, the thickness of the layers and regions are exaggerated for clarity.

FIGS. 1 to 9 are cross-sectional views illustrating a method of fabricating a capacitor according to embodiments of the present invention.

Referring to FIG. 1, an interlayer insulating layer 15 is formed on a semiconductor substrate 10. An attack barrier layer 17 is optionally formed on the interlayer insulating layer 15. The attack barrier layer 17 and the interlayer insulating layer 15 are patterned to form a contact hole which penetrates the attack barrier layer 17 and the interlayer insulating layer 15. Thereafter, a contact plug 20 is formed to fill the contact hole. The contact plug 20 may be formed of TiN, tungsten (W) or a combination of the TiN and W. The attack barrier layer 17 may be formed of a material layer which has excellent adhesive strength to the contact plug 20 such as a tantalum oxide layer. Thus, the attack barrier layer 17 serves to prevent a phenomenon that occurs whereby etchant flows along a sidewall of the contact plug 20 to mistakenly etch the interlayer insulating layer 15 in a subsequent wet etching process.

An oxidation barrier layer 25 is formed on the semiconductor substrate having the contact plug 20. In one example, the oxidation barrier layer 25 is formed of a silicon nitride layer. A support layer 27 is formed on the oxidation barrier layer 25. A molding layer 30 is formed on the support layer 27. The molding layer 30 may be formed of an oxide layer, a borophosphosilicate glass (BPSG) layer or a phosphosilicate glass (PSG) layer. It is preferred that the support layer 27 is formed of a material having a high wet etch selectivity compared to the molding layer 30. The support layer 27 may be formed of a tantalum oxide layer.

Figure 2:
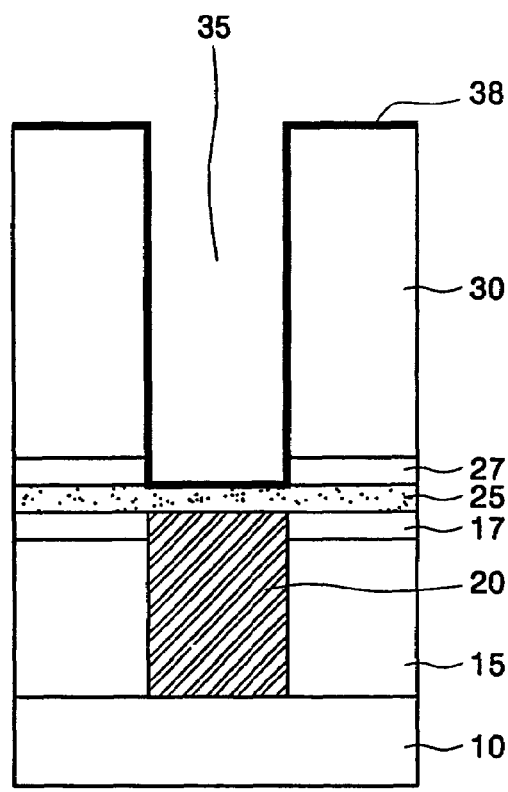

Referring to FIG. 2, the molding layer 30 and the support layer 27 are patterned to form a first lower electrode contact hole 35 which exposes a portion of the oxidation barrier layer 25 on the contact plug 20. A lower electrode seed layer 38 may be formed on the semiconductor substrate having the first lower electrode contact hole 35 using a physical vapor deposition (PVD) technique. The lower electrode seed layer 38 is thinly formed to serve as a seed of a lower electrode layer when the lower electrode layer is formed using a CVD technique or an ALD technique in the subsequent process. The lower electrode seed layer 38 is preferably formed of a noble metal layer. The noble metal layer may be formed of ruthenium, platinum or iridium.

Figure 3:
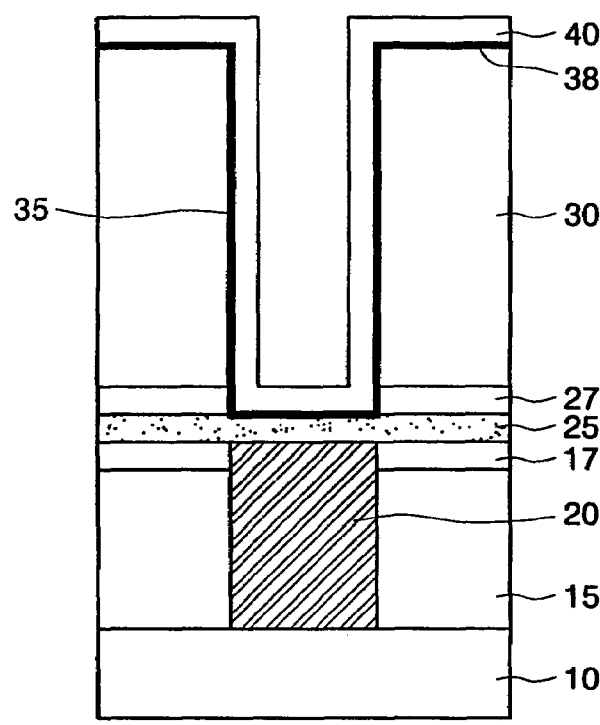

Referring to FIG. 3, a conformal lower electrode layer 40 is formed on the semiconductor substrate having the lower electrode seed layer 38. The lower electrode layer 40 is preferably formed of a noble metal layer. The noble metal layer may be formed of ruthenium, platinum or iridium. The lower electrode layer 40 is preferably formed using a CVD technique or an ALD technique. The CVD and ALD techniques comprise, for example, a PECVD technique or a plasma ALD technique, respectively. When the lower electrode layer 40 is formed using a CVD technique or an ALD technique, the lower electrode layer 40 can be formed to a uniform thickness on a bottom and a sidewall of the first lower electrode contact hole 35.

When the lower electrode layer 40 is formed of a noble metal layer using a CVD technique or an ALD technique, oxygen is preferably included in the process gas so as to obtain excellent layering quality. In this case, however, since the lower electrode layer 40 contains oxygen, an oxide layer is formed at an interface with the contact plug 20 when the lower electrode layer 40 comes into contact with the contact plug 20, thereby rapidly increasing contact resistance of the device. For example, when the contact plug 20 is formed of a TiN layer, due to oxygen contained in the lower electrode layer 40, a $TiO_2$ oxide layer is formed at the interface. For this reason, the lower electrode layer 40 which contains the oxygen is configured so as to not come into contact with the contact plug 20.

Figure 4:
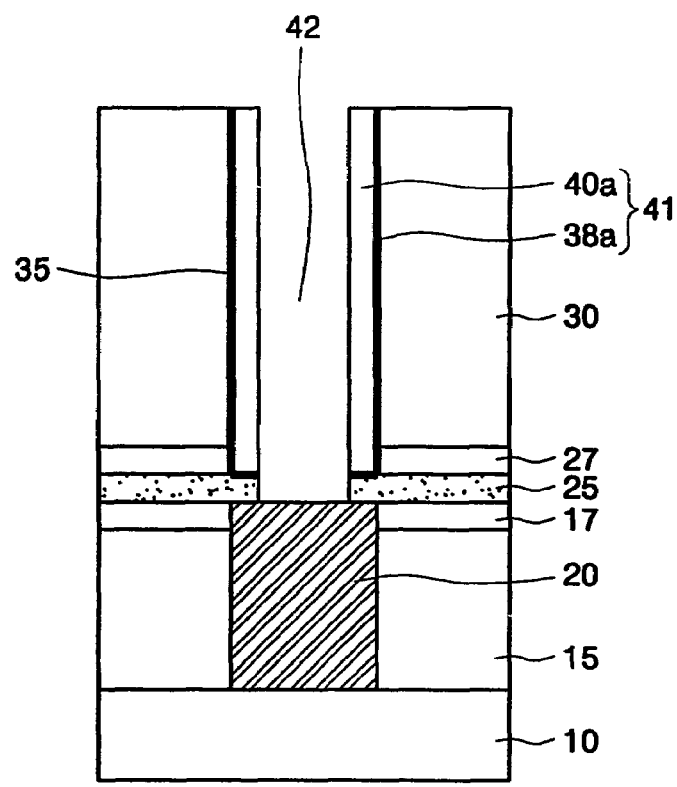

Referring to FIG. 4, the lower electrode layer 40 and the lower electrode seed layer 38 are etched back to expose the molding layer 30 and the oxidation barrier layer 25. As a result, a lower electrode seed layer pattern 38a and a lower electrode layer pattern 40a remain on an inner wall of the first lower electrode contact hole 35, thereby an electrode layer pattern 41 comprised of the lower electrode seed layer pattern 38a and the lower electrode layer pattern 40a is formed. Subsequently, an exposed portion of the oxidation barrier layer 25 is etched to form a second lower electrode contact hole 42 which exposes the contact plug 20. Thus, the electrode layer pattern 41 is spaced from the contact plug 20 by the oxidation barrier layer 25.

Figure 5:
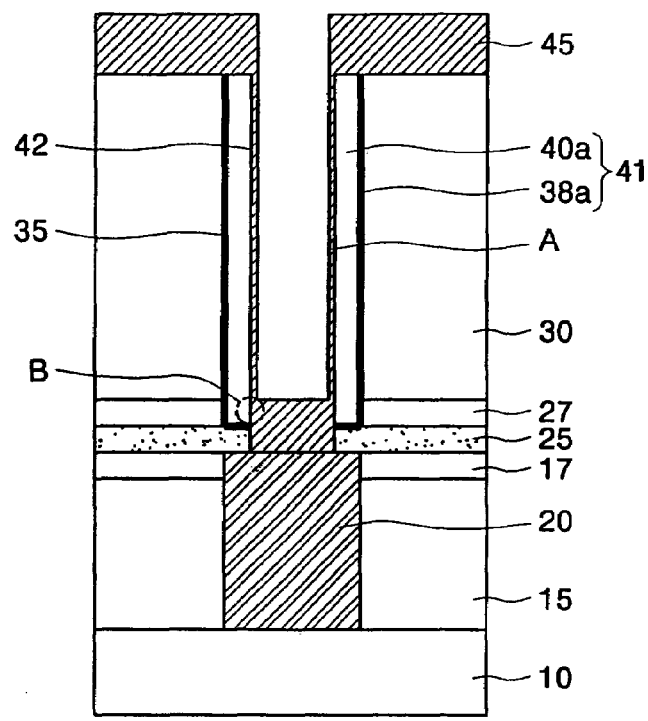

Referring to FIG. 5, a conformal conductive layer 45 is formed on the semiconductor substrate having the second lower electrode contact hole 42. Preferably, the conductive layer is formed of a noble metal layer. The noble metal layer may be formed of ruthenium, platinum or iridium. Preferably, the conductive layer 45 is formed using a PVD technique. The PVD technique includes a sputtering technique. When the conductive layer 45 is formed using the sputtering technique, the sputtering technique leads to poor step coverage. Thus, the conductive layer is relatively thickly formed on a top of the molding layer 30 and a bottom of the second lower electrode contact hole 42, and is relatively thinly formed on a sidewall of the second lower electrode contact hole 42, as shown in FIG. 5. A portion of the conductive layer 45 which fills the bottom of the second lower electrode contact hole 42 is formed to be thicker than the oxidation barrier layer 25, and a sidewall B of the conductive layer 45 which fills the bottom of the second lower electrode contact hole 42 is formed to be in electrical contact with the electrode layer pattern 41. A portion A of the conductive layer 45 which covers a sidewall of the second lower electrode contact hole 42 may be not deposited or very thinly deposited according to variations in process conditions. When the conductive layer 45 is formed of a noble metal layer such ruthenium, platinum or iridium using the sputtering technique, an inert gas such as argon may be used as a process gas. Thus, the conductive layer 45 does not contain oxygen. The conductive layer 45 is formed to be in contact with the contact plug 20. Accordingly, since the conductive layer 45 does not contain oxygen, an interface reaction such as an oxidation reaction does not occur at the interface with the contact plug 20 in a subsequent thermal heating process. Thereby, the phenomenon of increased contact resistance does not occur.

Figure 6:
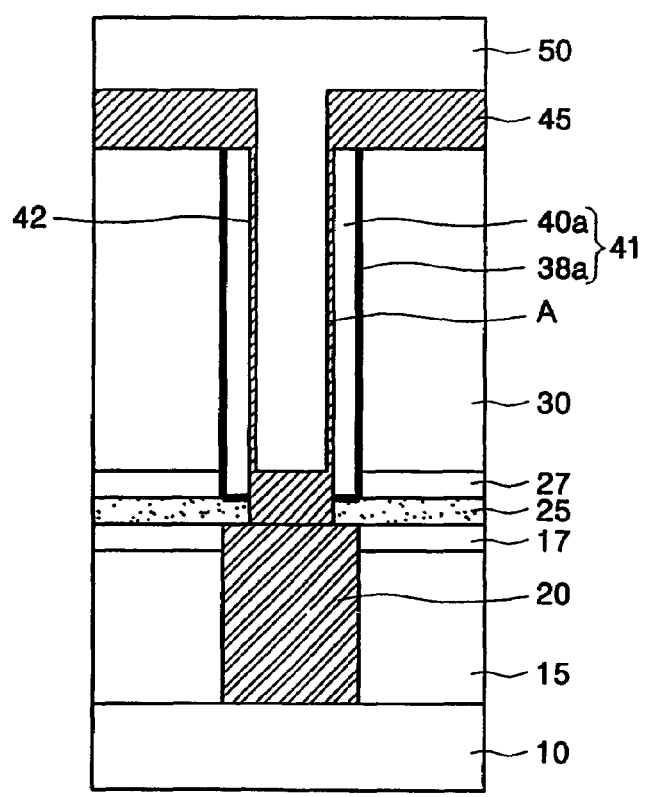

Referring to FIG. 6, a sacrificial layer 50 is formed on the semiconductor substrate having the conductive layer 45 to fill the second lower electrode contact hole 42. The sacrificial layer 50 is formed of an oxide layer, a BPSG layer or a PSG layer.

Figure 7:
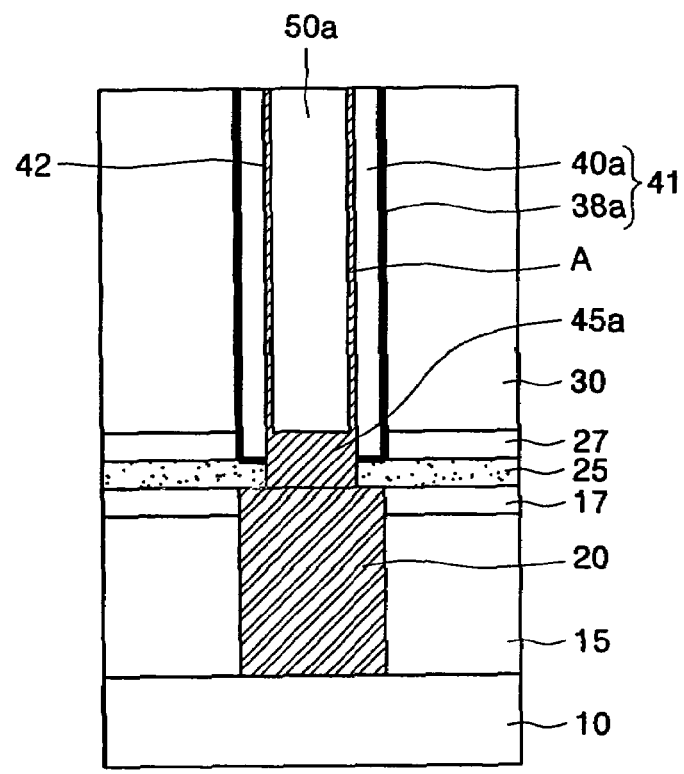

Referring to FIG. 7, the sacrificial layer 50 is dry etched until the conductive layer 45 formed on the molding layer 30 is exposed. Thereafter, the conductive layer 45 and the sacrificial layer 50 are etched back or planarized until the molding layer 30 is exposed. As a result, a conductive layer pattern 45a which covers a sidewall and a bottom of the second lower electrode contact hole 42 and a sacrificial layer pattern 50a which fills the inside of the conductive layer pattern 45a are formed.

Figure 8:
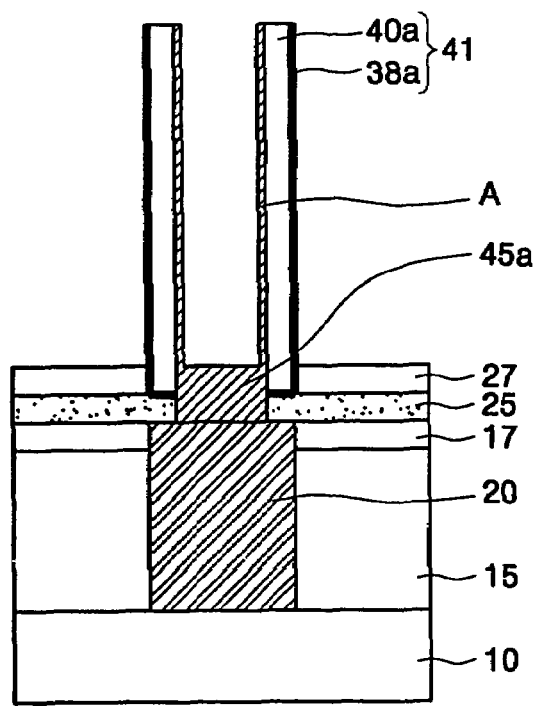

Referring to FIG. 8, the molding layer 30 and the sacrificial layer pattern 50a are removed in a wet etch process to expose an outer sidewall of the electrode layer pattern 41 and an inner wall of the conductive layer pattern 45a. As a result, a cylindrical lower electrode including the electrode layer pattern 41 and the conductive layer pattern 45a is formed on the contact plug 20. In this case, the support layer 27 which surrounds a lower portion of the outer sidewall of the electrode layer pattern 41 prevents the electrode layer pattern 41, i.e., the lower electrode, from collapsing. That is, when the support layer 27 is formed, it is possible to prevent a malfunction resulting from an electrical short between neighboring lower electrodes.

In addition, when the attack barrier layer 17 is formed of a material layer having an excellent adhesive strength to the contact plug 20 such as a tantalum oxide layer, the attack prevent layer 17 prevents a wet etchant from flowing into the interlayer insulating layer 15 during a wet etching process for removing the molding layer 30 and the sacrificial layer pattern 50a. Thus, the interlayer insulating layer 15 is not damaged during the wet etching process because of the presence of the attack barrier layer 17.

Alternatively, the wet etching process may selectively remove only the sacrificial layer pattern 50a. In this case, only an inner wall of the lower electrode is exposed so that a concave lower electrode is formed. On the contrary, the wet etching process may remove only the molding layer 30. In this case, only an outer sidewall of the lower electrode is exposed so that a stack type lower electrode, i.e., a box type lower electrode is formed.

Figure 9:
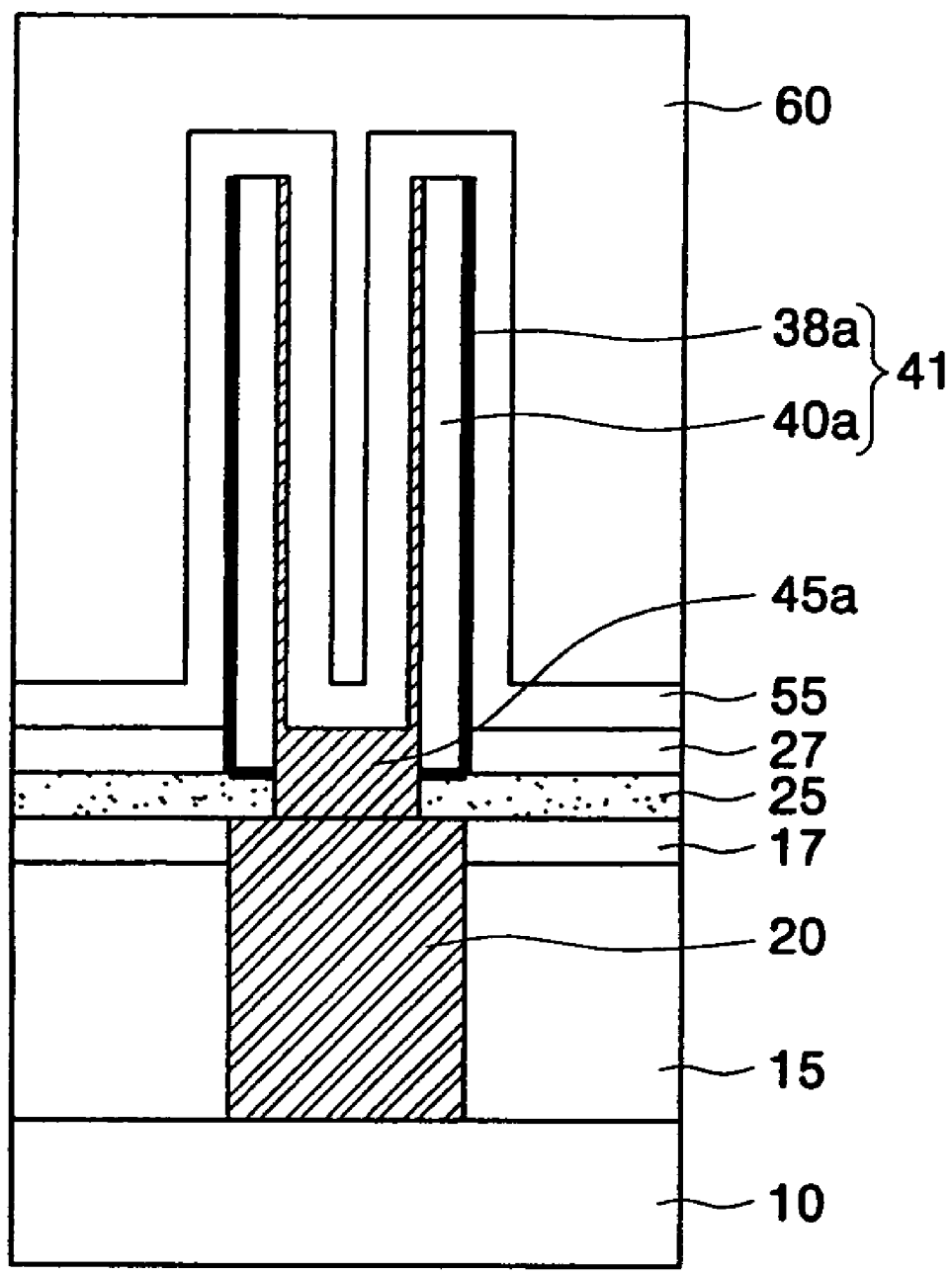

Referring to FIG. 9, a conformal dielectric layer 55 is formed on the semiconductor substrate having the cylindrical lower electrode. The dielectric layer 55 is formed of a $Ta_2O_5$ layer or a BST($(Ba,Sr)TiO_3$) layer. Heat treatment or plasma treatment may be performed to improve characteristics of the dielectric layer 55. An upper electrode 60 is formed on the semiconductor substrate having the dielectric layer 55. The upper electrode 60 is formed, for example, of a noble metal layer such as ruthenium, platinum or iridium.

The capacitor according to other embodiments of the present invention will be described below with reference to FIG. 9.

Referring to FIG. 9, an interlayer insulating layer 15 is disposed on a semiconductor substrate 10. The interlayer insulating layer 15 is formed of an oxide layer, a BPSG layer or a PSG layer. An attack barrier layer 17 may be disposed on the interlayer insulating layer 15. The attack barrier layer 17 may be formed of a tantalum oxide layer. The attack barrier layer 17 is disposed to prevent the interlayer insulating layer 15 from being damaged by an etchant which may flow therein during a wet etching process. A contact plug 20 which penetrates the attack barrier layer 17 and the interlayer insulating layer 15 and comes into contact with the semiconductor substrate is disposed in the interlayer insulating layer 15. The contact plug 20 is formed of TiN, tungsten (W) or a combination thereof. An oxidation barrier layer 25 which exposes a predetermined region of the contact plug 20 is disposed on the semiconductor substrate having the contact plug 20. The oxidation barrier layer 25 is formed, for example, of a silicon nitride layer.

A conductive layer pattern 45a is disposed on a portion of the contact plug 20 exposed by the oxidation barrier layer 25. Preferably, the conductive layer pattern 45a is a noble metal layer. The noble metal layer is formed of ruthenium, platinum or iridium. The conductive layer pattern 45a has a thickness that is greater than that of the oxidation barrier layer 25. An electrode layer pattern 41 which surrounds an outer sidewall of the conductive layer pattern 45a is disposed on the oxidation barrier layer 25. The electrode layer pattern 41 includes a lower electrode seed layer pattern 38a and a lower electrode layer pattern 40a. Preferably, the electrode layer pattern 41 is formed of a noble metal layer. The noble metal layer is formed of ruthenium, platinum or iridium. A portion A of the conductive layer pattern 45a is disposed to conformably surround an inner sidewall of the electrode layer pattern 41. Here, it is preferred that a thickness of the portion A of the conductive layer pattern 45a which conformably surrounds an inner sidewall of the electrode layer pattern 41 is less than about a tenth of the thickness of a portion of the conductive layer pattern 45a disposed above the contact plug 20.

A support layer 27 which surrounds a lower portion of the outer sidewall of the electrode layer pattern 41 may be disposed on the oxidation barrier layer 25. The support layer 27 supports the lower portion of the electrode layer pattern 41 and thus prevents an electrical short between the electrodes which may result from a collapse of the electrode layer pattern 41. Preferably, the support layer 27 has a wet etch selectivity much higher than that of a silicon oxide layer. The support layer 27 is formed, for example, of a tantalum oxide layer.

A conformal dielectric layer 55 is disposed on the semiconductor substrate having the electrode layer pattern 41. The dielectric layer 55 may be formed of a $Ta_2O_5$ or BST ($(Ba,Sr)TiO_3$) layer. An upper electrode 60 is disposed on the semiconductor substrate having the dielectric layer 55. The upper electrode 60 may be formed of a noble metal such as ruthenium, platinum and iridium.

As described above, according to the present invention, the lower electrode is formed of a noble metal such as ruthenium, platinum and iridium, and in order to prevent an increase of interface resistance with the contact plug that otherwise would occur, the lower electrode is formed in two steps. First, the lower electrode layer patterns which tower in an upward direction are formed using a CVD technique or an ALD technique, and second, the conductive layer pattern coming into contact with the contact plug is formed using a PVD technique. The conductive layer pattern formed using the PVD technique does not contain oxygen and thus prevents an interface reaction from occurring at the interface with the contact plug.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a capacitor, comprising:
forming an interlayer insulating layer on a semiconductor substrate;
forming a contact plug penetrating the interlayer insulating layer;
sequentially forming an oxidation barrier layer and a molding layer on the semiconductor substrate having the contact plug and the interlayer insulating layer;
patterning the molding layer to form a first lower electrode contact hole which exposes the oxidation barrier layer on the contact plug;
forming an electrode layer pattern covering an inner sidewall of the first lower electrode contact hole;
etching the oxidation barrier layer exposed by the electrode layer pattern to form a second lower electrode contact hole which exposes the contact plug; and
forming a conductive layer pattern covering an inner wall of the second lower electrode contact hole.

2. The method of claim 1, further comprising forming a sacrificial layer pattern which fills the conductive layer pattern.

3. The method of claim 2, wherein the conductive layer pattern is cylindrical in shape.

4. The method of claim 1, wherein the electrode layer pattern and the conductive layer pattern are formed of a noble metal layer.

5. The method of claim 4, wherein the noble metal layer is formed of any one of ruthenium, platinum and iridium.

6. The method of claim 1, wherein the electrode layer pattern is formed of a lower electrode layer pattern or a lower electrode seed layer pattern and a lower electrode layer pattern.

7. The method of claim 6, wherein the lower electrode layer pattern is formed using any one of a chemical vapor deposition (CVD) technique and an atomic layer deposition (ALD) technique.

8. The method of claim 7, wherein the CVD and ALD techniques are plasma enhanced CVD (PECVD) and plasma ALD techniques, respectively.

9. The method of claim 6, wherein the lower electrode seed layer pattern is formed using a physical vapor deposition (PVD) technique.

10. The method of claim 1, wherein the conductive layer pattern is formed using a PVD technique.

11. The method of claim 1, further comprising forming an attack barrier layer on the interlayer insulating layer before forming the contact plug, after forming the interlayer insulating layer, wherein the contact plug is formed to penetrate the interlayer insulating layer and the attack barrier layer.

12. The method of claim 1, further comprising forming a support layer on the oxidation barrier layer before forming the molding layer on the oxidation barrier layer, wherein the first lower electrode contact hole is formed by patterning the molding layer and the support layer to thereby expose the oxidation barrier layer on the contact plug.

13. The method of claim 1, wherein the oxidation barrier layer is formed of a silicon nitride layer.

14. The method of claim 1, wherein the contact plug is formed of any one of TiN, tungsten (W) and a combination thereof.

* * * * *